(12) United States Patent
Miller et al.

(10) Patent No.: US 11,646,235 B2
(45) Date of Patent: May 9, 2023

(54) VERTICAL TUNNELING FIELD EFFECT TRANSISTOR WITH DUAL LINER BOTTOM SPACER

(71) Applicant: International Business Machines Corporation, Armonk, NY (US)

(72) Inventors: Eric Miller, Watervliet, NY (US); Marc A. Bergendahl, Rensselaer, NY (US); Kangguo Cheng, Schenectady, NY (US); Sean Teehan, Rensselaer, NY (US); John Sporre, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/382,442

(22) Filed: Jul. 22, 2021

(65) Prior Publication Data

US 2021/0351082 A1    Nov. 11, 2021

Related U.S. Application Data

(62) Division of application No. 16/590,512, filed on Oct. 2, 2019, now Pat. No. 11,152,266.

(51) Int. Cl.
*H01L 21/8234* (2006.01)
*H01L 29/08* (2006.01)
(Continued)

(52) U.S. Cl.
CPC ............ *H01L 21/823487* (2013.01); *H01L 21/02532* (2013.01); *H01L 21/02592* (2013.01); *H01L 21/823412* (2013.01); *H01L 21/823437* (2013.01); *H01L 21/823468* (2013.01); *H01L 21/823481* (2013.01); *H01L 27/088* (2013.01);
(Continued)

(58) Field of Classification Search
None
See application file for complete search history.

(56) References Cited

U.S. PATENT DOCUMENTS 9,780,197 B1   10/2017   Xie et al.
9,799,749 B1   10/2017   Bi et al.
(Continued)

OTHER PUBLICATIONS

IBM "List of IBM Patents or Patent Applications Treated as Related; (Appendix P)", Filed Jul. 21, 2021, 2 pages.

*Primary Examiner* — Vincent Wall
(74) *Attorney, Agent, or Firm* — Cantor Colburn LLP; Erik Johnson

(57) ABSTRACT

Embodiments of the present invention are directed to fabrication method and resulting structures for vertical tunneling field effect transistors (VFETs) having a dual liner bottom spacer. In a non-limiting embodiment of the invention, a first liner is formed on a top surface of a source or drain (S/D) region and sidewalls of a semiconductor fin. Portions of a spacer are removed to expose a first region and a second region of the first liner. The first region of the first liner is directly on the S/D region and the second region is over the semiconductor fin. A second liner is formed on the first liner. A first portion of the second liner is formed by selectively depositing dielectric material on the exposed first region and exposed second region of the first liner. The first liner and the second liner collectively define the dual liner bottom spacer.

5 Claims, 17 Drawing Sheets

(51) Int. Cl.

| | |
|---|---|
| *H01L 29/66* | (2006.01) |
| *H01L 29/10* | (2006.01) |
| *H01L 21/02* | (2006.01) |
| *H01L 29/78* | (2006.01) |
| *H01L 27/088* | (2006.01) |
| *H01L 21/762* | (2006.01) |

(52) U.S. Cl.
CPC ...... *H01L 29/0847* (2013.01); *H01L 29/1037* (2013.01); *H01L 29/6653* (2013.01); *H01L 29/6656* (2013.01); *H01L 29/66666* (2013.01); *H01L 29/7827* (2013.01); *H01L 21/76224* (2013.01)

(56) References Cited

U.S. PATENT DOCUMENTS

| | | | |
|---|---|---|---|
| 9,799,777 | B1 | 10/2017 | Balakrishnan et al. |
| 10,056,289 | B1 * | 8/2018 | Cheng ............... H01L 29/66666 |
| 10,134,893 | B2 | 11/2018 | Anderson et al. |
| 10,229,986 | B1 | 3/2019 | Jagannathan et al. |
| 10,468,525 | B1 * | 11/2019 | Cheng ................... H01L 27/092 |
| 2005/0101120 | A1 | 5/2005 | Hause et al. |
| 2018/0005895 | A1 * | 1/2018 | Cheng ............ H01L 21/823487 |
| 2018/0212040 | A1 | 7/2018 | Bao et al. |
| 2018/0226491 | A1 * | 8/2018 | Bi ....................... H01L 29/7827 |
| 2021/0104440 | A1 | 4/2021 | Miller et al. |

\* cited by examiner

VERTICAL TUNNELING FIELD EFFECT TRANSISTOR WITH DUAL LINER BOTTOM SPACER

BACKGROUND

The present invention generally relates to fabrication methods and resulting structures for semiconductor devices, and more specifically, to fabrication method and resulting structures for vertical tunneling field effect transistors (VFETs) having a dual liner bottom spacer.

Traditional metal oxide semiconductor field effect transistor (MOSFET) fabrication techniques include process flows for constructing planar field effect transistors (FETs). A planar FET includes a substrate (also referred to as a silicon slab), a gate formed over the substrate, source and drain regions formed on opposite ends of the gate, and a channel region near the surface of the substrate under the gate. The channel region electrically connects the source region to the drain region while the gate controls the current in the channel. The gate voltage controls whether the path from drain to source is an open circuit ("off") or a resistive path ("on").

In recent years, research has been devoted to the development of nonplanar transistor architectures. For example, vertical tunneling FETs employ semiconductor fins and side-gates that can be contacted outside the active region, resulting in increased device density and some increased performance over lateral devices. In contrast to planar FETs, the source to drain current in a VFET flows through the vertical fin in a direction that is perpendicular with respect to a horizontal major surface of the wafer or substrate. A VFET can achieve a smaller device footprint because its channel length is decoupled from the contacted gate pitch.

SUMMARY

Embodiments of the invention are directed to a method for forming a semiconductor device. A non-limiting example of the method includes forming a first liner on a top surface of a source or drain (S/D) region and sidewalls of a semiconductor fin. Portions of a spacer are removed to expose a first region and a second region of the first liner. The first region of the first liner is directly on the S/D region and the second region is over the semiconductor fin. A second liner is formed on the first liner. A first portion of the second liner is formed by selectively depositing dielectric material on the exposed first region and exposed second region of the first liner. The first liner and the second liner collectively define the dual liner bottom spacer.

Embodiments of the invention are directed to a method for forming a semiconductor device. A non-limiting example of the method includes forming a first semiconductor fin and a second semiconductor fin on a substrate. A bottom S/D is formed on a surface of the substrate. The bottom S/D can be positioned between the semiconductor fins and the substrate. A shallow trench isolation region is formed in the substrate and a gate is formed over a channel region of the first semiconductor fin and the second semiconductor fin. A dual liner bottom spacer is formed between the bottom S/D and the gate. The dual liner bottom spacer includes an oxide liner and a nitride liner. The oxide liner includes a stepped shaped directly adjacent to the shallow trench isolation region and a convex shape between the first semiconductor fin and the second semiconductor fin and subsequent non-isolation adjacent fins.

Embodiments of the invention are directed to a semiconductor structure. A non-limiting example of the semiconductor device includes a first semiconductor fin and a second semiconductor fin on a substrate. A bottom source or drain (S/D) is on a surface of the substrate and positioned between the semiconductor fins and the substrate. A shallow trench isolation region is formed in the substrate and a gate is formed over a channel region of the first semiconductor fin and the second semiconductor fin. The structure includes a dual liner bottom spacer between the bottom S/D and the gate. The dual liner bottom spacer including a first liner and a second liner. The first liner includes a stepped shaped directly adjacent to the shallow trench isolation region and a convex shape between the first semiconductor fin and the second semiconductor fin and subsequent non-isolation adjacent fins.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1:
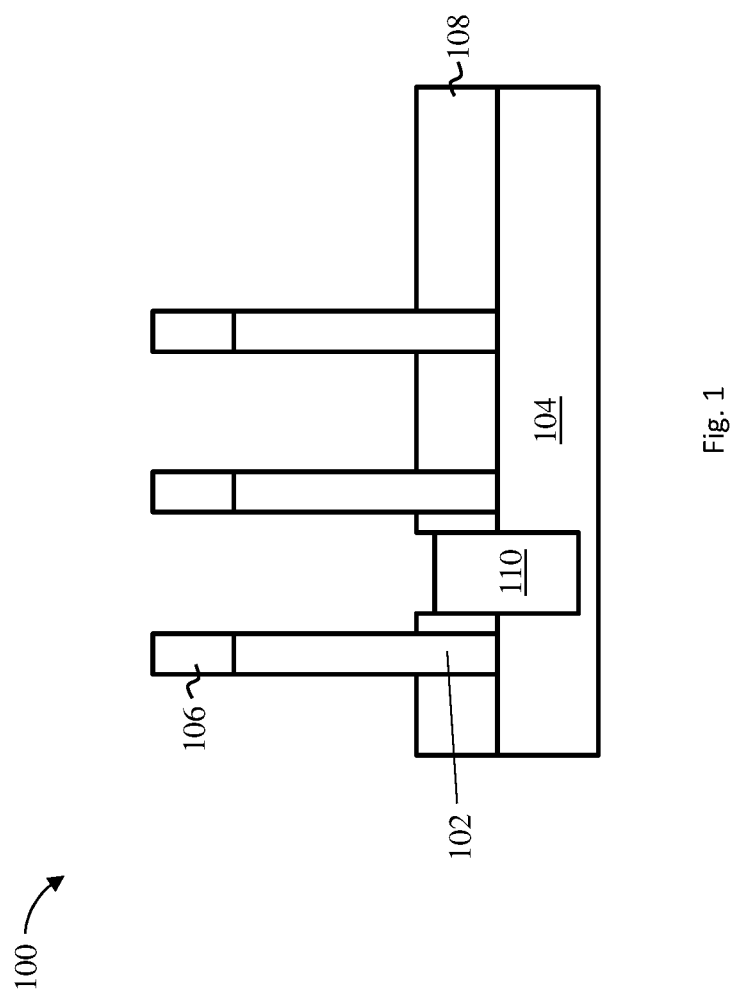
FIG. 1 depicts a cross-sectional view of a semiconductor structure after an initial set of processing operations according to one or more embodiments of the invention.

The diagrams depicted herein are illustrative. There can be many variations to the diagram or the operations described therein without departing from the spirit of the invention. For instance, the actions can be performed in a differing order or actions can be added, deleted or modified.

In the accompanying figures and following detailed description of the described embodiments of the invention, the various elements illustrated in the figures are provided with two or three-digit reference numbers. With minor exceptions, the leftmost digit(s) of each reference number correspond to the figure in which its element is first illustrated.

DETAILED DESCRIPTION

It is understood in advance that although example embodiments of the invention are described in connection with a particular transistor architecture, embodiments of the invention are not limited to the particular transistor architectures or materials described in this specification. Rather, embodiments of the present invention are capable of being implemented in conjunction with any other type of transistor architecture or materials now known or later developed.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the present invention, continued scaling of VFET devices is restricted in part due to the presence of non-ideal bottom spacer profiles in the shallow trench isolation (STI) regions. In particular, an STI recess below the top of the epitaxially grown bottom source/drain can damage the bottom spacer, thereby changing the bottom spacer profile. A damaged bottom spacer can lead to gate to source/drain shorts as well as reliability and performance losses in the final device.

Turning now to an overview of aspects of the present invention, one or more embodiments of the invention address the above-described shortcomings of the prior art by providing a fabrication method and resulting new semiconductor structure that includes a dual liner and selective deposition scheme configured and arranged to improve the profile quality of the bottom spacer. Accordingly, aspects of the present invention can mitigate the bottom spacer damage that results from the STI recess below the top of the bottom source/drain.

Turning now to a more detailed description of aspects of the present invention, FIGS. 1-15 depict cross-sectional views of a semiconductor structure 100 that results from fabrication operations applied according to one or more embodiments of the invention. In embodiments of the invention, the final semiconductor device (shown in FIG. 15) can be a variety of types of MOSFETs, including, for example, non-planar n-type field effect transistors (NFET) and p-type field effect transistors (PFET). For example, the final semiconductor device can be an n-type VFET or a p-type VFET.

In FIG. 1, an initial set of fabrication operations has been used to form the structure 100 such that it includes a substrate 104, a bottom S/D region 108, a STI region 110, fins 102, and hard masks 106, configured and arranged as shown. The fins 102 can be formed on the substrate 104 using known front-end-of-line (FEOL) VFET fabrication techniques. While the semiconductor structure 100 is shown having three fins 102 for ease of illustration, it is understood that any number of fins can be formed over or in the substrate 104. The substrate 104 and the fins 102 can be made of any suitable semiconductor material, such as, for example, monocrystalline Si, silicon germanium (SiGe), III-V compound semiconductor, II-VI compound semiconductor, or semiconductor-on-insulator (SOI). Group III-V compound semiconductors, for example, include materials having at least one group III element and at least one group V element, such as one or more of aluminum gallium arsenide (AlGaAs), aluminum gallium nitride (AlGaN), aluminum arsenide (AlAs), aluminum indium arsenide (AlIAs), aluminum nitride (AlN), gallium antimonide (GaSb), gallium aluminum antimonide (GaAlSb), gallium arsenide (GaAs), gallium arsenide antimonide (GaAsSb), gallium nitride (GaN), indium antimonide (InSb), indium arsenide (InAs), indium gallium arsenide (InGaAs), indium gallium arsenide phosphide (InGaAsP), indium gallium nitride (InGaN), indium nitride (InN), indium phosphide (InP) and alloy combinations including at least one of the foregoing materials. The alloy combinations can include binary (two elements, e.g., gallium (III) arsenide (GaAs)), ternary (three elements, e.g., InGaAs) and quaternary (four elements, e.g., aluminum gallium indium phosphide (AlInGaP)) alloys.

In some embodiments of the invention, the substrate 104 and the fins 102 can be made of a same semiconductor material. In other embodiments of the invention, the substrate 104 can be made of a first semiconductor material, and the fins 102 can be made of a second semiconductor material. In some embodiments of the invention, the substrate 104 and the fins 102 can be made of silicon or SiGe. In some embodiments of the invention, the substrate 104 is a silicon substrate and the fins 102 are silicon germanium fins having a germanium concentration of about 10 to about 80 percent. The fins 102 can each have a height ranging from 4 nm to 150 nm. In some embodiments of the present invention, the fins 102 are formed to a height of about 60 nm, although other fin heights are within the contemplated scope of the invention.

In some embodiments of the invention, the substrate 104 can include a buried oxide layer (not depicted). The buried oxide layer can be made of any suitable dielectric material, such as, for example, a silicon oxide. In some embodiments of the invention, the buried oxide layer is formed to a thickness of about 145 nm, although other thicknesses are within the contemplated scope of the invention.

In some embodiments of the invention, a hard mask 106 (fin mask) is patterned over a top surface of the fins 102. The hard mask 106 can be formed using any suitable process. In some embodiments of the invention, the hard mask 106 can be formed using, for example, a chemical vapor deposition (CVD), plasma-enhanced CVD (PECVD), ultrahigh vacuum chemical vapor deposition (UHVCVD), rapid thermal chemical vapor deposition (RTCVD), metalorganic chemical vapor deposition (MOCVD), low-pressure chemical vapor deposition (LPCVD), limited reaction processing CVD (LRPCVD), atomic layer deposition (ALD), flowable CVD, spin-on dielectrics, physical vapor deposition (PVD), molecular beam epitaxy (MBE), chemical solution deposition, spin-on dielectrics, or other like process. The hard mask 106 can be made of any suitable dielectric material, such as, for example, a low-k dielectric, a nitride, silicon nitride, silicon oxide, SiON, SiC, SiOCN, or SiBCN. In some embodiments of the invention, the hard mask 106 is a silicon nitride hard mask.

As shown in FIG. 1, in some embodiments of the invention, a bottom source or drain (S/D) region 108 is formed over the substrate 104 at a base of the fins 102. In some embodiments of the invention, the Bottom S/D region 108 is epitaxially grown on exposed surfaces of the substrate 104. In some embodiments of the invention, the Bottom S/D region 108 is formed to a thickness of about 10 nm to about 60 nm, for example 30 nm, although other thicknesses are within the contemplated scope of the invention.

The Bottom S/D region 108 can be epitaxially grown using, for example, vapor-phase epitaxy (VPE), molecular beam epitaxy (MBE), liquid-phase epitaxy (LPE), or other suitable processes. The Bottom S/D region 108 can be semiconductor materials epitaxially grown from gaseous or liquid precursors.

In some embodiments of the invention, the gas source for the epitaxial deposition of semiconductor material includes a silicon containing gas source, a germanium containing gas source, or a combination thereof. For example, a silicon layer can be epitaxially deposited (or grown) from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. A germanium layer can be epitaxially deposited from a germanium gas source that is selected from the group consisting of germane, digermane, halogermane, dichlorogermane, trichlorogermane, tetrachlorogermane and combinations thereof. A silicon germanium alloy layer can be epitaxially formed utilizing a combination of such gas sources. Carrier gases like hydrogen, nitrogen, helium and argon can be used. In some embodiments of the invention, the epitaxial semiconductor materials include carbon doped silicon (Si:C). This Si:C layer can be grown in the same chamber used for other epitaxy steps or in a dedicated Si:C epitaxy chamber. The Si:C can include carbon in the range of about 0.2 percent to about 3.0 percent.

Epitaxially grown silicon and silicon germanium can be doped by adding n-type dopants (e.g., P or As) or p-type dopants (e.g., Ga, B, $BF_2$, or Al). In some embodiments of the invention, the Bottom S/D region 108 can be epitaxially formed and doped by a variety of methods, such as, for example, in-situ doped epitaxy (doped during deposition), doped following the epitaxy, or by implantation and plasma doping. The dopant concentration in the doped regions can range from $1\times10^{19}$ $cm^{-3}$ to $2\times10^{21}$ $cm^{-3}$, or between $1\times10^{20}$ $cm^{-3}$ and $1\times10^{21}$ $cm^{-3}$.

In some embodiments of the invention, the bottom S/D region 108 is made of silicon germanium. In some embodiments of the invention, the Bottom S/D region 108 is made of silicon germanium having a germanium concentration of about 10 to about 65 percent, for example, 50 percent, although other germanium concentrations are within the contemplated scope of the invention.

As further shown in FIG. 1, a shallow trench isolation region 110 can be formed in the substrate 104. In some embodiments of the invention, the shallow trench isolation region 110 is recessed below a top surface of the Bottom S/D region 108. As discussed previously herein, recessing the shallow trench isolation region can cause a non-ideal bottom spacer profile.

The shallow trench isolation region 110 can be formed by forming a trench in the substrate 104 and filling the trench with dielectric material, such as, a low-k dielectric, an oxide, a nitride, silicon nitride, silicon oxide, SiON, SiC, SiOCN, or SiBCN. The shallow trench isolation region 110 provides electrical isolation between adjacent devices on the substrate 104.

Figure 2:
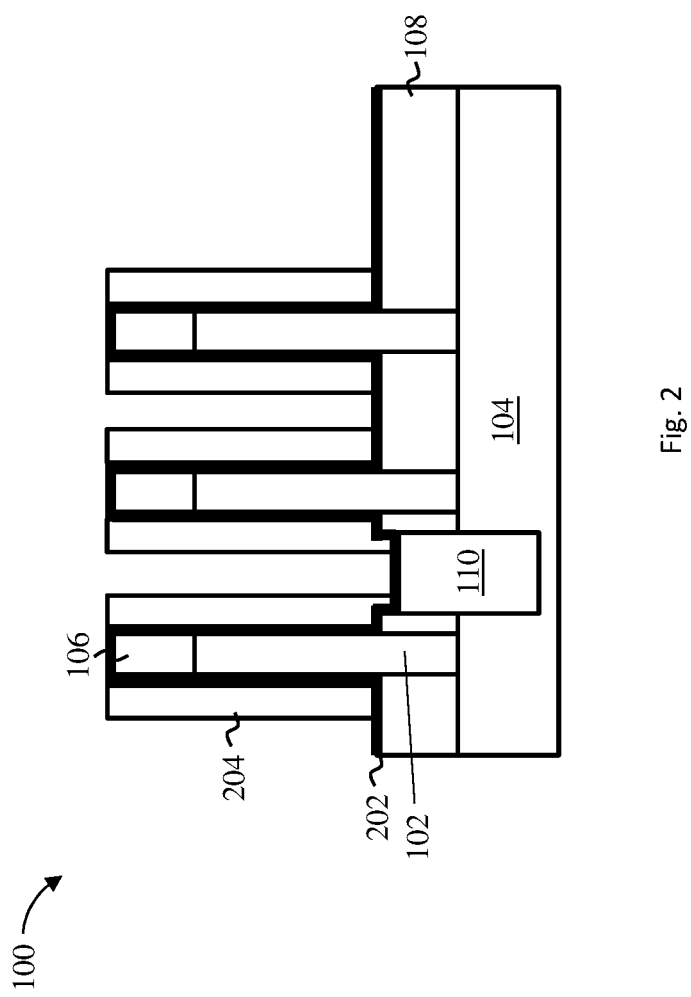
FIG. 2 depicts a cross-sectional view of the semiconductor structure after additional processing operations according to one or more embodiments of the invention.

FIG. 2 depicts a cross-sectional view of the semiconductor structure 100 after a processing operation according to one or more embodiments of the invention. In some embodiments of the invention, a liner 202 (sometimes referred to as a first layer of a dual liner bottom spacer) is formed over the semiconductor structure 100. In some embodiments of the invention, the liner 202 is an oxide liner. The liner 202 can be formed using any suitable process, such as CVD, PECVD, ALD, flowable CVD, spin-on dielectrics, or PVD. In some embodiments of the invention, the liner 202 is conformally formed over the semiconductor structure 100.

Figure 4:
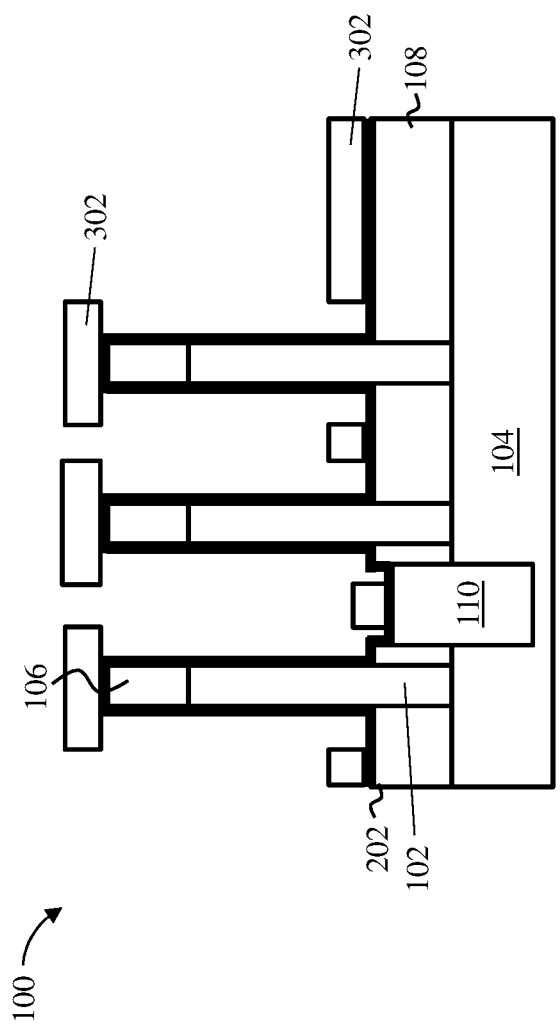
FIG. 4 depicts a cross-sectional view of the semiconductor structure after additional processing operations according to one or more embodiments of the invention.

In some embodiments of the invention, a quality, thickness, and/or material of the liner 202 is selected such that a sacrificial spacer 204 can be selectively removed without removing the liner 202 (see FIG. 4). For example, a sacrificial spacer made of amorphous silicon can be removed selective to a liner of silicon oxynitride (SiON). Alternatively, dielectric materials that do not provide etch selectivity to the sacrificial spacer 204 can also be used, by varying the thickness of the liner 202. For example, the thickness of the liner 202 can be increased to compensate for any loss in liner thickness that occurs when removing the sacrificial spacer 204.

In some embodiments of the invention, the sacrificial spacer 204 is formed on sidewalls of the liner 202. In some embodiments of the invention, portions of the sacrificial spacer 204 are formed over the shallow trench isolation region 110. The sacrificial spacer 204 can be formed using any suitable process. In some embodiments of the invention, the sacrificial spacer 204 is conformally deposited over the semiconductor structure 100 and then patterned, using for example, a spacer etch back. In this manner, remaining portions of the conformal deposition define the sacrificial spacer 204. The sacrificial spacer 204 can be made of any suitable material. In some embodiments of the invention, material for the sacrificial spacer 204 is selected to ensure that the sacrificial spacer 204 can be removed selective to the liner 202. In some embodiments of the invention, the sacrificial spacer 204 is amorphous silicon.

Figure 3:
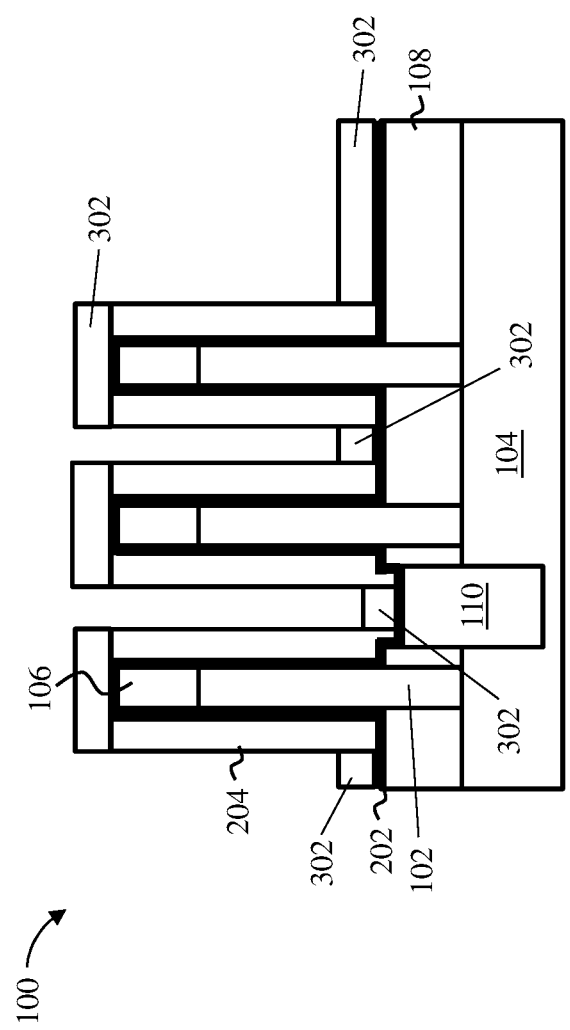
FIG. 3 depicts a cross-sectional view of the semiconductor structure after additional processing operations according to one or more embodiments of the invention.

FIG. 3 depicts a cross-sectional view of the semiconductor structure 100 after a processing operation according to one or more embodiments of the invention. In some embodiments of the invention, a dielectric layer 302 (sometimes referred to as a second layer of a dual liner bottom spacer) is deposited or formed on a top surface of the liner 202 and on a top surface of the sacrificial spacer 204. The dielectric layer 302 can be formed using any suitable process, such as CVD, PECVD, ALD, flowable CVD, spin-on dielectrics, or PVD. In some embodiments of the invention, the dielectric layer 302 is formed to a thickness of about 10 nm to about 60 nm, for example 30 nm, although other thicknesses are within the contemplated scope of the invention.

In some embodiments of the invention, the dielectric layer 302 is selectively deposited only on exposed dielectric surfaces of the semiconductor structure 100. In other words, the dielectric layer 302 can be selectively deposited onto the top surface of the liner 202 and the top surface of the sacrificial spacer 204. Advantageously, selectively depositing the dielectric layer 302 on dielectric material ensures that the thickness of the dielectric layer 302 is greater on the horizontal surfaces than the vertical surfaces after adding additional dielectric material (discussed with respect to FIG. 5).

FIG. 4 depicts a cross-sectional view of the semiconductor structure 100 after a processing operation according to one or more embodiments of the invention. In some embodiments of the invention, the sacrificial spacer 204 is removed, using, for example, a wet etch, a dry etch, an ashing process, and/or a stripping process. In some embodiments of the invention, the sacrificial spacer 204 is removed selective to the liner 202 and/or the dielectric layer 302. As discussed previously herein, a quality, thickness, and/or material of the liner 202 can be selected such that the sacrificial spacer 204 can be selectively removed without removing the liner 202. For example, an amorphous silicon sacrificial material can be stripped selective to silicon oxynitride (SiON).

Figure 5:
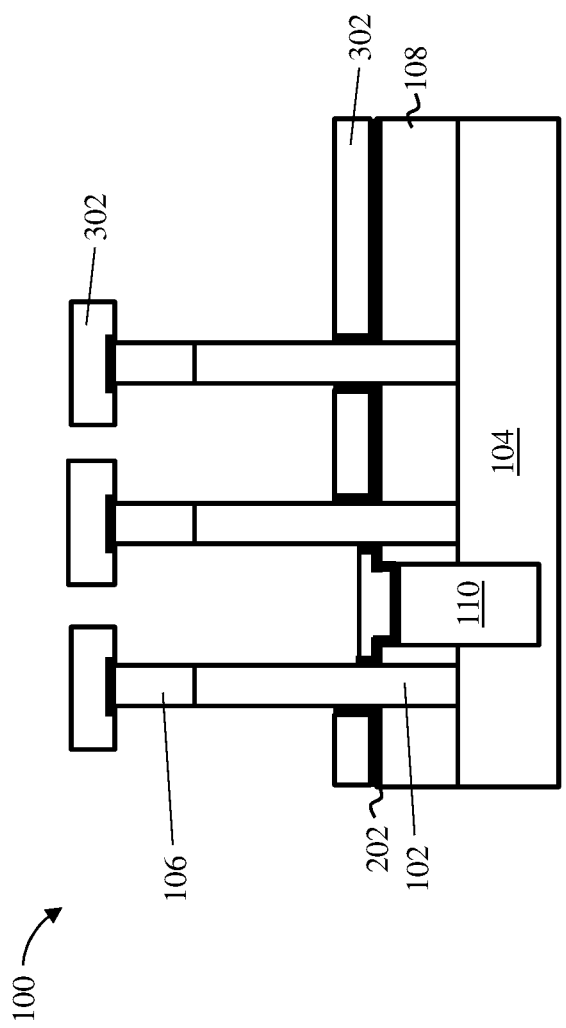
FIG. 5 depicts a cross-sectional view of the semiconductor structure after additional processing operations according to one or more embodiments of the invention.

FIG. 5 depicts a cross-sectional view of the semiconductor structure 100 after a processing operation according to one or more embodiments of the invention. In some embodiments of the invention, additional dielectric material is conformally deposited over the semiconductor structure 100. In some embodiments of the invention, the dielectric material is the same material as the dielectric layer 302, defining a single dielectric region. Due to the selective deposition shown in FIG. 3, the dielectric layer 302 can have a first thickness on the horizontal surfaces of the semiconductor structure 100 (i.e., over the bottom S/D region 108) and a second, smaller thickness on vertical surfaces (i.e., sidewalls of the fins 102). In other words, the additional dielectric material can be conformally deposited (to a same nominal thickness) on all exposed surfaces of the dielectric layer 302 and the liner 202, resulting in a uniform increase in the thickness of the dielectric layer 302. As the horizontal surfaces of the semiconductor structure 100 already contained dielectric material (i.e., portions of the dielectric layer 302 prior to depositing the additional dielectric material, as shown in FIG. 4), the horizontal thickness of the dielectric layer 302 will be greater than the vertical thickness after uniformly depositing the additional dielectric material.

As further shown in FIG. 5 portions of the dielectric layer 302 (and additional dielectric material) and portions of the liner 202 can be removed to expose sidewalls of the fins 102. The exposed sidewalls of the fins 102 define channel regions of the semiconductor structure 100. In some embodiments of the invention, portions of the dielectric layer 302 are removed using a wet etch that removes material equally from horizontal and vertical surfaces. As the horizontal surfaces will have extra dielectric material due to the selective deposition of the dielectric layer 302 on horizontal surfaces as shown in FIG. 3, the sidewalls of the fins 102 can be selectively exposed without removing portions of the dielectric layer 302 formed over the bottom S/D region 108. In other words, the dielectric layer 302 can be globally recessed until the relatively thin portions of the dielectric layer 302 on the vertical surfaces of the semiconductor structure 100 are removed, leaving only remaining portions of the (initially) thicker horizontal portions. As further shown in FIG. 5, remaining portions of the liner 202 and the dielectric layer 302 collectively define a bottom spacer having a dual liner structure.

Figure 6:
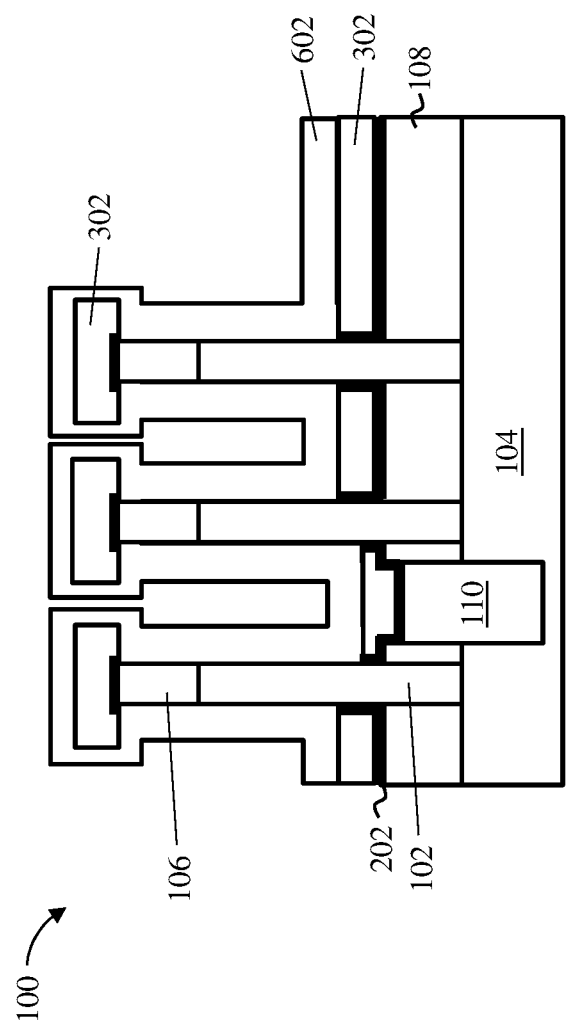
FIG. 6 depicts a cross-sectional view of the semiconductor structure after additional processing operations according to one or more embodiments of the invention.

FIG. 6 depicts a cross-sectional view of the semiconductor structure 100 after a processing operation according to one or more embodiments of the invention. In some embodiments of the invention, gates 602 are formed over the channel region of the fins 102 and over surfaces of the dielectric layer 302. In some embodiments of the invention, the gates 602 are conformally formed over the semiconductor structure 100.

In some embodiments of the invention, the gates 602 can be high-k metal gates (HKMGs) formed using, for example, known replacement metal gate (RMG) processes, or so-called gate-first processes. The gates 602 can include high-k dielectric material(s) (e.g., a gate dielectric) and a work function metal stack (not shown). In some embodiments of the invention, the gates 602 further includes a main body formed from bulk conductive gate material(s).

In some embodiments of the invention, the gate dielectrics include a high-k dielectric film formed on a surface (sidewall) of the fins 102 (not shown). The high-k dielectric film can be made of, for example, silicon oxide, silicon nitride, silicon oxynitride, boron nitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k materials can further include dopants such as lanthanum and aluminum. In some embodiments of the invention, the high-k dielectric film can have a thickness of about 0.5 nm to about 4 nm. In some embodiments of the invention, the high-k dielectric film includes hafnium oxide and has a thickness of about 1 nm, although other thicknesses are within the contemplated scope of the invention.

In some embodiments of the invention, the gates 602 include one or more work function layers (sometimes referred to as a work function metal stack) formed between the high-k dielectric film and a bulk gate material. In some embodiments of the invention, the gates 602 include one or more work function layers, but do not include a bulk gate material.

The work function layers can be made of, for example, aluminum, lanthanum oxide, magnesium oxide, strontium titanate, strontium oxide, titanium nitride, tantalum nitride, hafnium nitride, tungsten nitride, molybdenum nitride, niobium nitride, hafnium silicon nitride, titanium aluminum nitride, tantalum silicon nitride, titanium aluminum carbide, tantalum carbide, and combinations thereof. The work function layer can serve to modify the work function of the gates 602 and enables tuning of the device threshold voltage. The work function layers can be formed to a thickness of about 0.5 to 6 nm, although other thicknesses are within the contemplated scope of the invention. In some embodiments of the invention, each of the work function layers can be formed to a different thickness.

In some embodiments of the invention, a bulk gate conductive material is deposited over the work function layers. The bulk gate material can include any suitable conducting material, such as, for example, metal (e.g., tungsten, titanium, tantalum, ruthenium, zirconium, cobalt, copper, aluminum, lead, platinum, tin, silver, gold), conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), conductive carbon, graphene, or any suitable combination of these materials. The conductive material can further include dopants that are incorporated during or after deposition.

Figure 7:
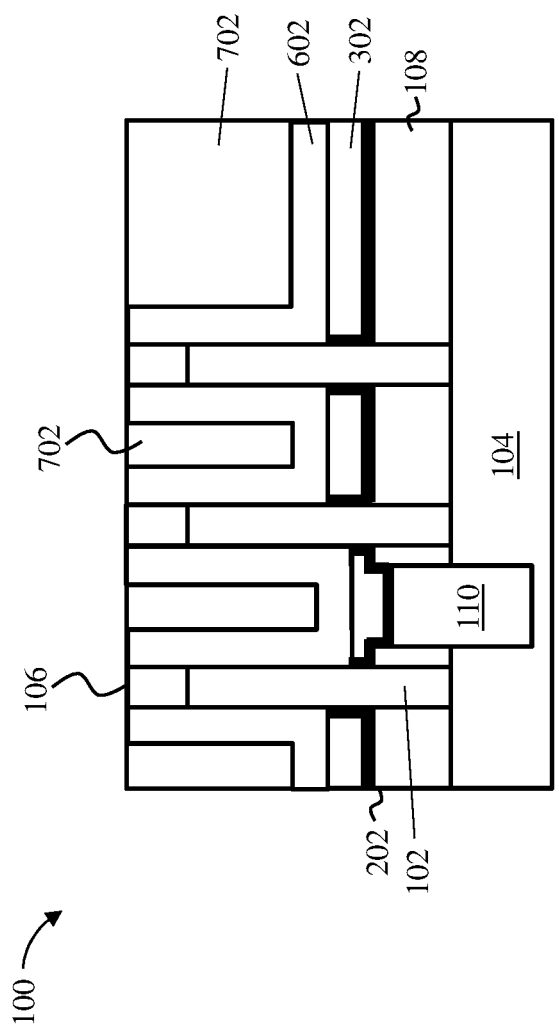
FIG. 7 depicts a cross-sectional view of the semiconductor structure after additional processing operations according to one or more embodiments of the invention.

FIG. 7 depicts a cross-sectional view of the semiconductor structure 100 after a processing operation according to one or more embodiments of the invention. In some embodiments of the invention, an interlayer dielectric 702 can be formed over the semiconductor structure 100. The interlayer dielectric 702 serves as an isolation structure for the semiconductor fins 102. The interlayer dielectric 702 can be made of any suitable dielectric material, such as, for example, porous silicates, carbon doped oxides, silicon dioxides, silicon nitrides, silicon oxynitrides, silicon carbide (SiC), or other dielectric materials. Any known manner of forming the interlayer dielectric 702 can be utilized, such as, for example, CVD, PECVD, ALD, flowable CVD, spin-on dielectrics, or PVD.

As further shown in FIG. 7, a surface of the semiconductor structure 100 can be recessed and planarized, using, for example a chemical-mechanical planarization (CMP) process. In some embodiments of the invention, the semiconductor structure 100 is planarized to expose a surface of the hard mask 106. In some embodiments of the invention, the semiconductor structure 100 is planarized selective to a surface of the hard mask 106. In some embodiments of the invention, the semiconductor structure 100 is planarized below a portion of the dielectric layer 302 formed on the top surface of the fins 102.

Figure 8:
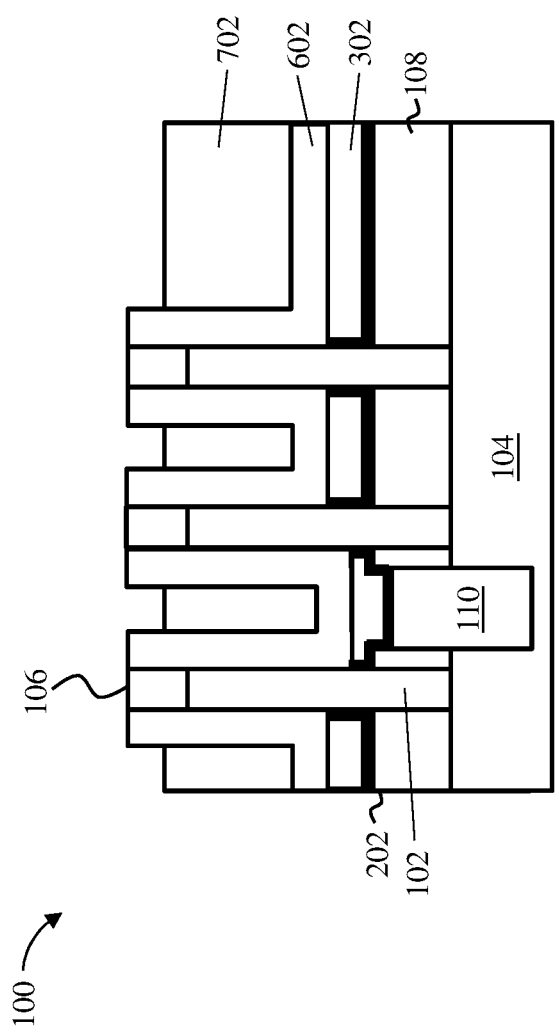
FIG. 8 depicts a cross-sectional view of the semiconductor structure after additional processing operations according to one or more embodiments of the invention.

FIG. 8 depicts a cross-sectional view of the semiconductor structure 100 after a processing operation according to one or more embodiments of the invention. In some embodiments of the invention, the interlayer dielectric 702 can be recessed below a top surface of the hard mask 106. The interlayer dielectric 702 can be recessed using any suitable method, such as a wet etch, a dry etch, or a combination of sequential wet and/or dry etches. In some embodiments of the invention, the interlayer dielectric 702 is recessed selective to the hard mask 106 and/or the gates 602. In some embodiments of the invention, the interlayer dielectric 702 is recessed using an isotropic oxide etch.

Figure 9:
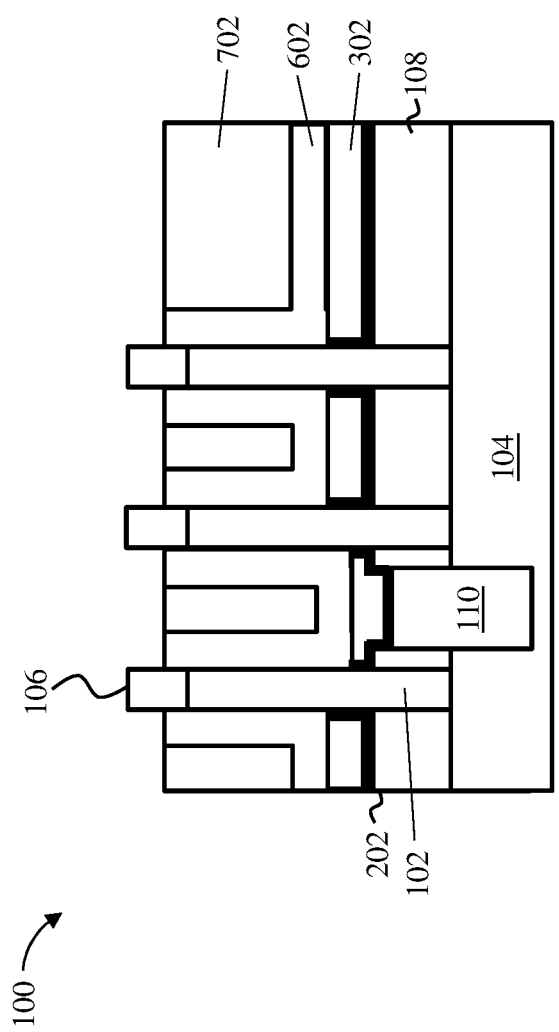
FIG. 9 depicts a cross-sectional view of the semiconductor structure after additional processing operations according to one or more embodiments of the invention.

FIG. 9 depicts a cross-sectional view of the semiconductor structure 100 after a processing operation according to one or more embodiments of the invention. In some embodiments of the invention, the gates 602 can be recessed below a top surface of the hard mask 106. The gates 602 can be recessed using any suitable method, such as a wet etch, a dry etch, or a combination of sequential wet and/or dry etches. In some embodiments of the invention, the gates 602 are recessed selective to the hard mask 106.

Figure 10:
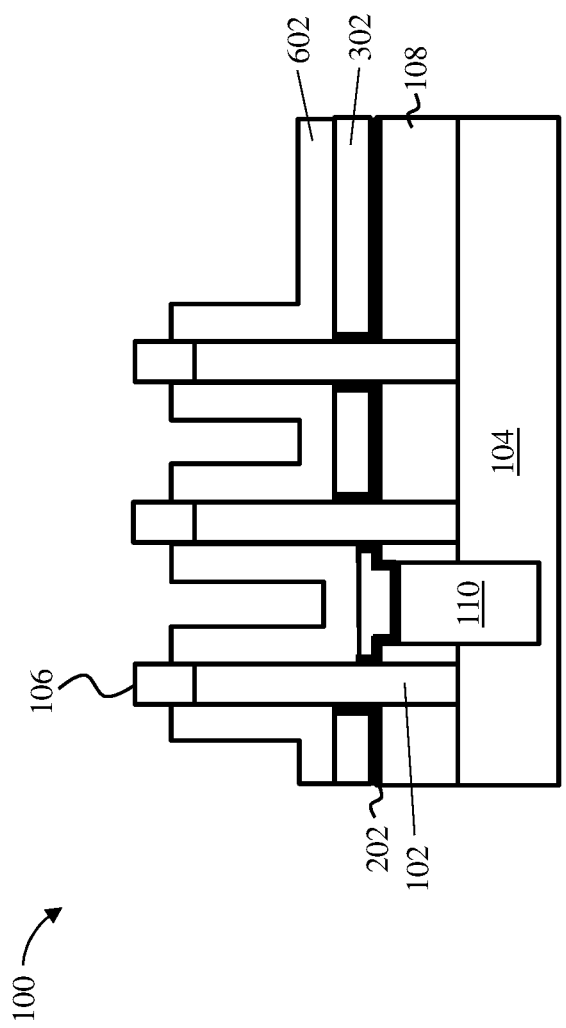
FIG. 10 depicts a cross-sectional view of the semiconductor structure after additional processing operations according to one or more embodiments of the invention.

FIG. 10 depicts a cross-sectional view of the semiconductor structure 100 after a processing operation according to one or more embodiments of the invention. In some embodiments of the invention, the interlayer dielectric 702 can be removed to expose a sidewall of the gates 602. The interlayer dielectric 702 can be removed using any suitable method, such as a wet etch, a dry etch, or a combination of sequential wet and/or dry etches. In some embodiments of the invention, the interlayer dielectric 702 is removed selective to the hard mask 106 and/or the gates 602. In some embodiments of the invention, the interlayer dielectric 702 is removed using an oxide wet stripping process.

Figure 11:
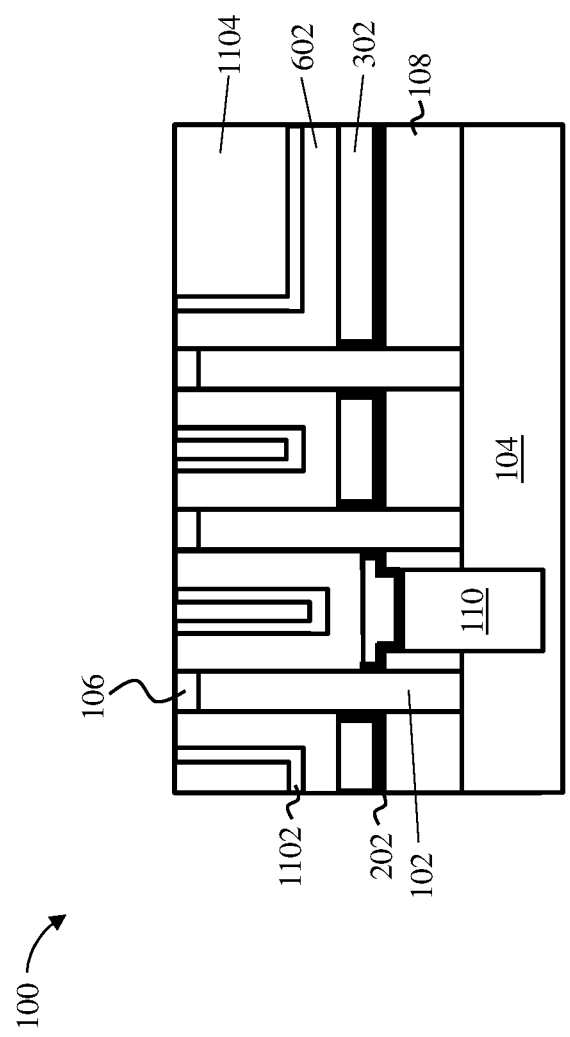
FIG. 11 depicts a cross-sectional view of the semiconductor structure after additional processing operations according to one or more embodiments of the invention.

FIG. 11 depicts a cross-sectional view of the semiconductor structure 100 after a processing operation according to one or more embodiments of the invention. In some embodiments of the invention, a liner 1102 (sometimes referred to as a dielectric liner) can be formed on exposed sidewalls and a bottom surface of the gates 602.

In some embodiments of the invention, the liner 1102 is formed using a conformal deposition process, such as CVD or ALD. The liner 1102 can be made of any suitable material, such as, for example, a low-k dielectric, a nitride, silicon nitride, silicon oxide, SiON, SiC, SiOCN, or SiBCN. A low-k dielectric can include a dielectric material having a dielectric constant less than the dielectric constant of silicon dioxide (e.g., less than about 3.9). The liner 1102 can be formed to a thickness of about 5 to 10 nm, although other thicknesses are within the contemplated scope of the invention.

As further illustrated in FIG. 11, an interlayer dielectric 1104 can be formed over the semiconductor structure 100. The interlayer dielectric 1104 can be made of any suitable dielectric material, such as, for example, porous silicates, carbon doped oxides, silicon dioxides, silicon nitrides, silicon oxynitrides, silicon carbide (SiC), or other dielectric materials. Any known manner of forming the interlayer dielectric 1104 can be utilized, such as, for example, CVD, PECVD, ALD, flowable CVD, spin-on dielectrics, or PVD. In some embodiments of the invention, the semiconductor structure 100 is then planarized to a level within the hard mask 106.

Figure 12:
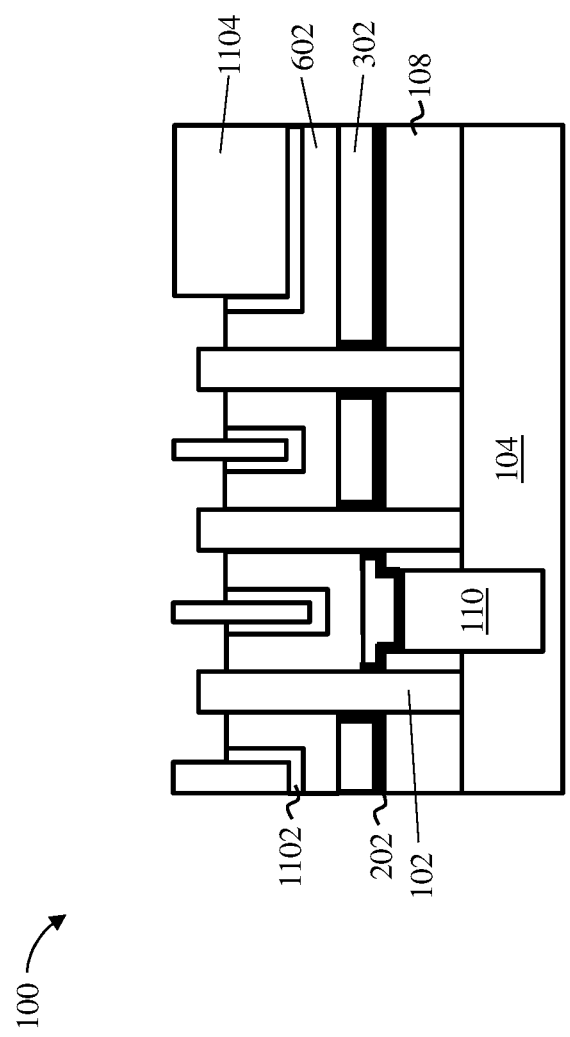
FIG. 12 depicts a cross-sectional view of the semiconductor structure after additional processing operations according to one or more embodiments of the invention.

FIG. 12 depicts a cross-sectional view of the semiconductor structure 100 after a processing operation according to one or more embodiments of the invention. In some embodiments of the invention, portions of the gates 602 and the liner 1102 are recessed below a top surface of the fins 102. In some embodiments of the invention, the hard mask 106 is removed during this recess. The gates 602 and the liner 1102 can be recessed using any suitable method, such as a wet etch, a dry etch, or a combination of sequential wet and/or dry etches. In some embodiments of the invention, the gates 602 and the liner 1102 are recessed selective to the fins 102.

Figure 13:
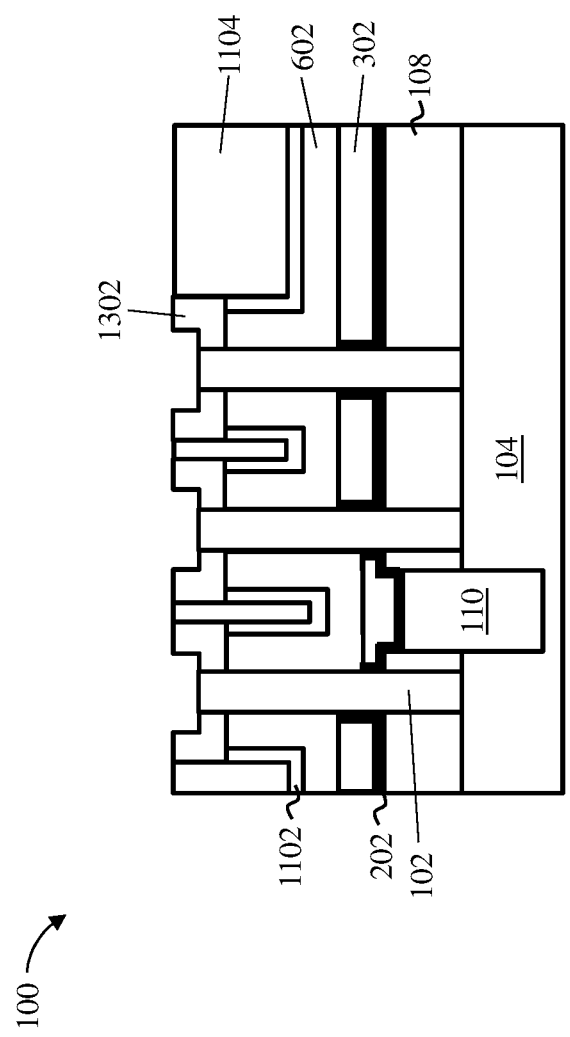
FIG. 13 depicts a cross-sectional view of the semiconductor structure after additional processing operations according to one or more embodiments of the invention.

FIG. 13 depicts a cross-sectional view of the semiconductor structure 100 after a processing operation according to one or more embodiments of the invention. In some embodiments of the invention, a top spacer 1302 can be formed on the recessed surfaces of the gates 602 and the liner 1102. In some embodiments of the invention, the top spacer 1302 is formed by first depositing a conformal layer using a conformal deposition process, such as CVD or ALD (not shown). The conformal layer can then the patterned to expose a surface of the interlayer dielectric 1104.

The top spacer 1302 can be made of any suitable material, such as, for example, a low-k dielectric, a nitride, silicon nitride, silicon oxide, SiON, SiC, SiOCN, or SiBCN. In some embodiments of the invention, the top spacer 1302 is made of a same dielectric material as the liner 1102. In some embodiments of the invention, the top spacer 1302 is made of a different dielectric material than the liner 1102. The top spacer 1302 can be formed to a thickness of about 5 to 10 nm, although other thicknesses are within the contemplated scope of the invention.

Figure 14:
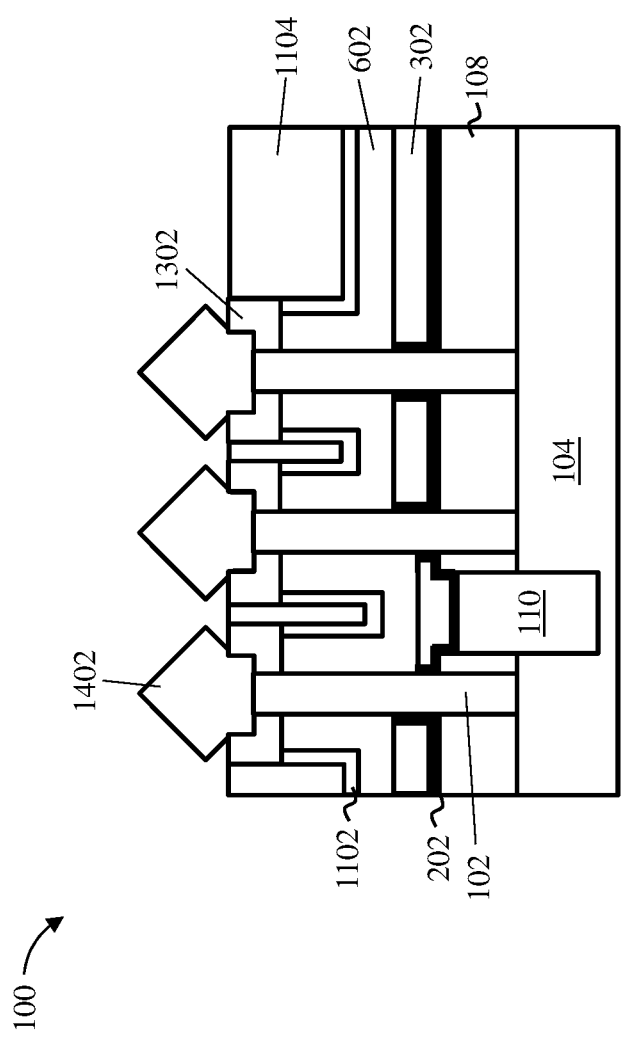
FIG. 14 depicts a cross-sectional view of the semiconductor structure after additional processing operations according to one or more embodiments of the invention.

FIG. 14 depicts a cross-sectional view of the semiconductor structure 100 after a processing operation according to one or more embodiments of the invention. In some embodiments of the invention, a top S/D region 1402 can be formed on a top surface of the fins 102. The top S/D region 1402 can be formed and doped in a similar manner as the bottom S/D region 108. In some embodiments of the invention, the top S/D region 1402 is epitaxially grown from the exposed top surface of the fins 102.

Figure 15:
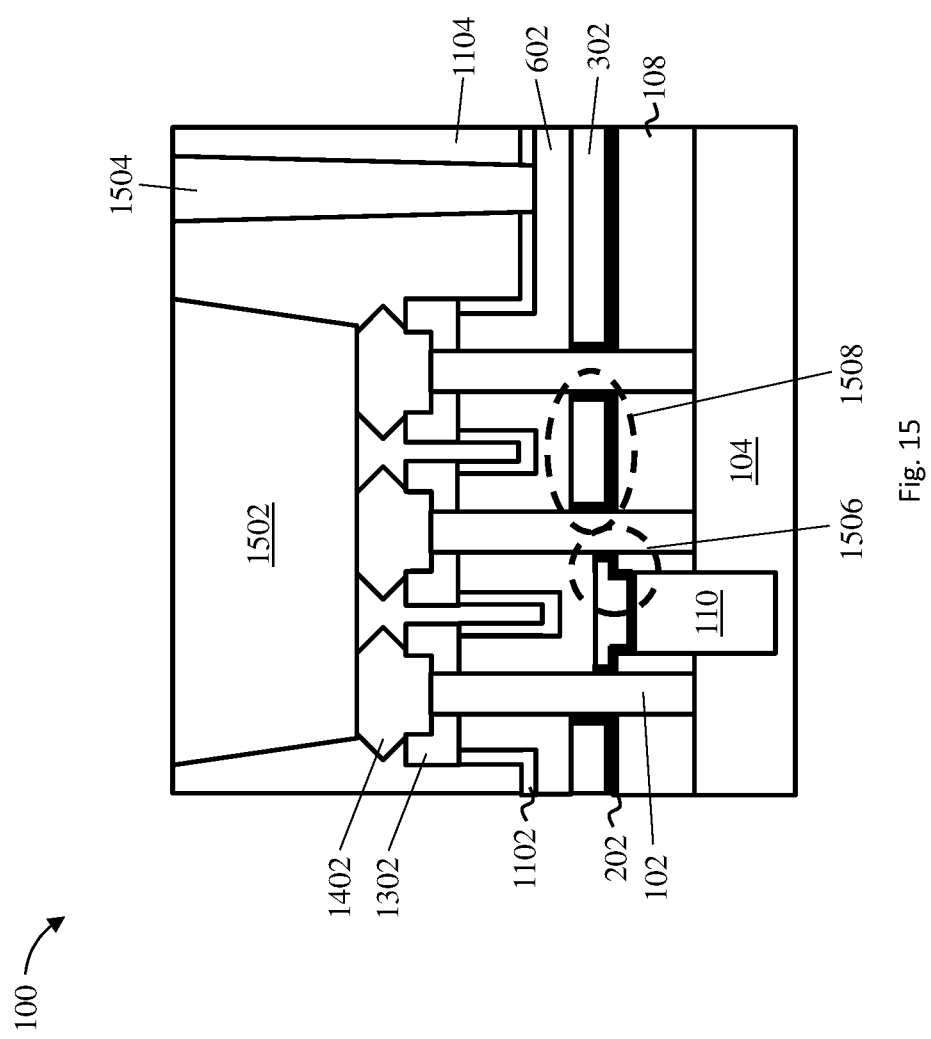
FIG. 15 depicts a cross-sectional view of the semiconductor structure after additional processing operations according to one or more embodiments of the invention.

FIG. 15 depicts a cross-sectional view of the semiconductor structure 100 after a processing operation according to one or more embodiments of the invention. In some embodiments of the invention, a S/D contact 1502 and a gate contact 1504 can be formed by depositing or forming conductive material within trenches (not separately shown) formed in the interlayer dielectric 1104. In some embodiments of the invention, the S/D contact 1502 is formed in direct contact with a top surface of the top S/D region 1402. In some embodiments of the invention, the gate contact 1504 is formed in direct contact with the gates 602 (after punching through or removing a portion of the liner 1102).

The S/D contact 1502 and the gate contact 1504 can be formed or deposited using known metallization techniques. In some embodiments of the invention, the S/D contact 1502 and the gate contact 1504 are overfilled above a surface of the interlayer dielectric 704, forming overburdens that can be removed using, for example, CMP. The S/D contact 1502 and the gate contact 1504 can be made of any suitable conducting material, such as, for example, metal (e.g., tungsten, titanium, tantalum, ruthenium, zirconium, cobalt, copper, aluminum, platinum), conducting metallic compound material (e.g., tantalum nitride, titanium nitride, tantalum carbide, titanium carbide, titanium aluminum carbide, tungsten silicide, tungsten nitride, cobalt silicide, nickel silicide), conductive carbon, or any suitable combination of these materials. In some embodiments of the invention, the S/D contact 1502 and the gate contact 1504 are cobalt or tungsten contacts. The conductive material can further include dopants that are incorporated during or after deposition. In some embodiments of the invention, the S/D contact 1502 and the gate contact 1504 can each include a barrier metal liner (not depicted). Material examples include tantalum nitride and tantalum (TaN/Ta), titanium, titanium nitride, cobalt, ruthenium, and manganese.

As further shown in FIG. 15, the previously described process (illustrated in FIGS. 1-15) results in a bottom spacer (the liner 202 and the dielectric layer 302, collectively referred to as the bottom spacer) having a unique dual liner structure. In particular, the liner 202 will have a stepped shape near a shallow trench isolation region (e.g., near the shallow trench isolation region 110) as shown in detail 1506. For example, the liner 202 can be conformally formed on sidewalls and a top surface of the S/D region 108 in the area directly adjacent to the shallow trench isolation region 110. In addition, the liner 202 will have a U-shape (convex shape) under the bottom spacer region in areas not directly adjacent to a shallow trench isolation (e.g., the shallow trench isolation 110) as shown in detail 1508. For example, the liner 202 can be conformally formed on sidewalls of the fins 102 and along a surface of the S/D region 108 in the area between adjacent fins of the fins 102. While the details 1506 and 1508 are only shown for the three fins 102, it is understood that the unique dual liner structure will exist for any number of fins. In other words, regions near a shallow trench isolation region will have a stepped shape similar to that shown in detail 1506, while regions remote from a shallow trench isolation region (i.e., between adjacent fins) will have a U-shape similar to that shown in detail 1508.

Figure 16:
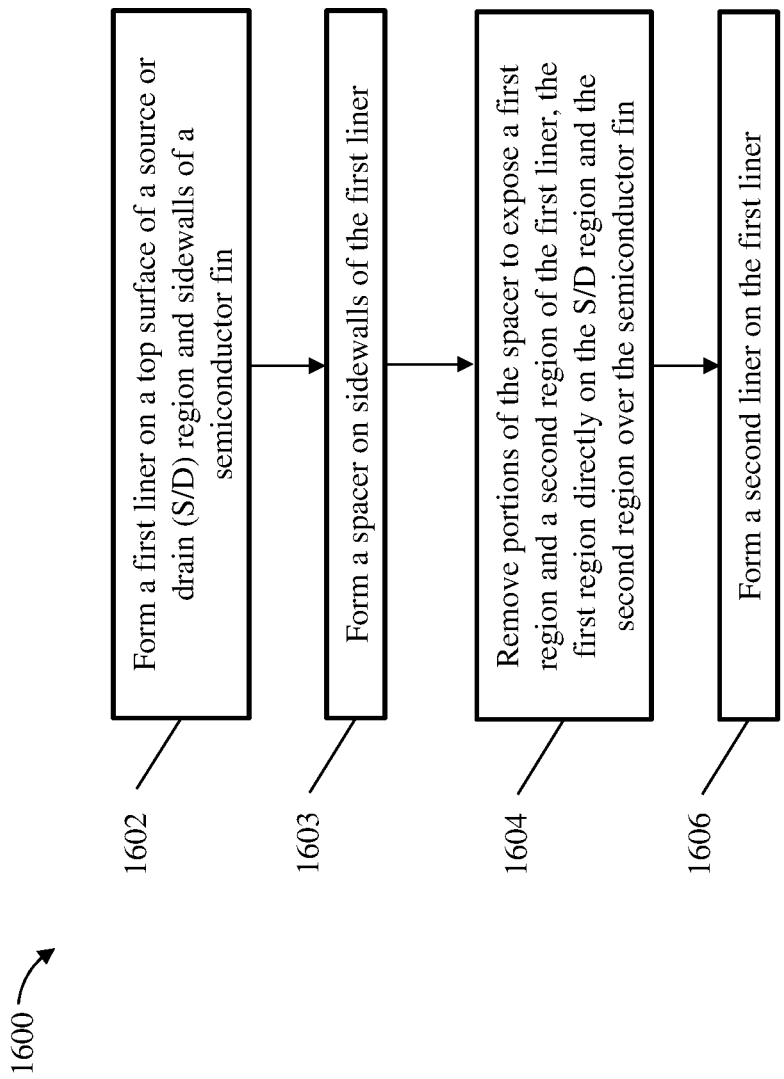
FIG. 16 depicts a flow diagram illustrating a method according to one or more embodiments of the invention.

FIG. 16 depicts a flow diagram 1600 illustrating a method for forming a semiconductor device according to one or more embodiments of the invention. As shown at block 1602, a first liner is formed on a top surface of a S/D region and sidewalls of a semiconductor fin. In some embodiments of the invention, the first liner is formed by conformally depositing dielectric material over the top surface of the S/D region and sidewalls of the semiconductor fin. In some embodiments of the invention, the first liner includes a stepped shaped directly adjacent to a shallow trench isolation region and a convex shape between the semiconductor fin and another semiconductor fin.

At block 1603, a spacer is formed on sidewalls of the first liner. At block 1604, portions of the spacer are removed to expose a first region and a second region of the first liner. In some embodiments of the invention, the first region is directly on the S/D region and the second region is over the semiconductor fin. In some embodiments of the invention, the spacer is formed on sidewalls of the first liner. In some embodiments of the invention, forming the spacer further includes conformally depositing spacer material over the first liner. In some embodiments of the invention, the spacer material includes amorphous silicon.

At block 1606, a second liner is formed on the first liner. In some embodiments of the invention, a first portion of the second liner is formed by selectively depositing dielectric material on the exposed first region and exposed second region of the first liner. In some embodiments of the invention, a second portion of the second liner is formed by depositing additional dielectric material on the first portion of the second liner after removing the spacer. In some embodiments of the invention, the additional dielectric material is conformally deposited such that the second liner includes a first thickness over the S/D region and a second thickness on sidewalls of the semiconductor fin. In some embodiments of the invention, the second thickness is less than the first thickness.

In some embodiments of the invention, the first liner and the second liner collectively define a dual liner bottom spacer. In some embodiments of the invention, the first liner includes an oxide and the second liner includes a nitride.

Figure 17:
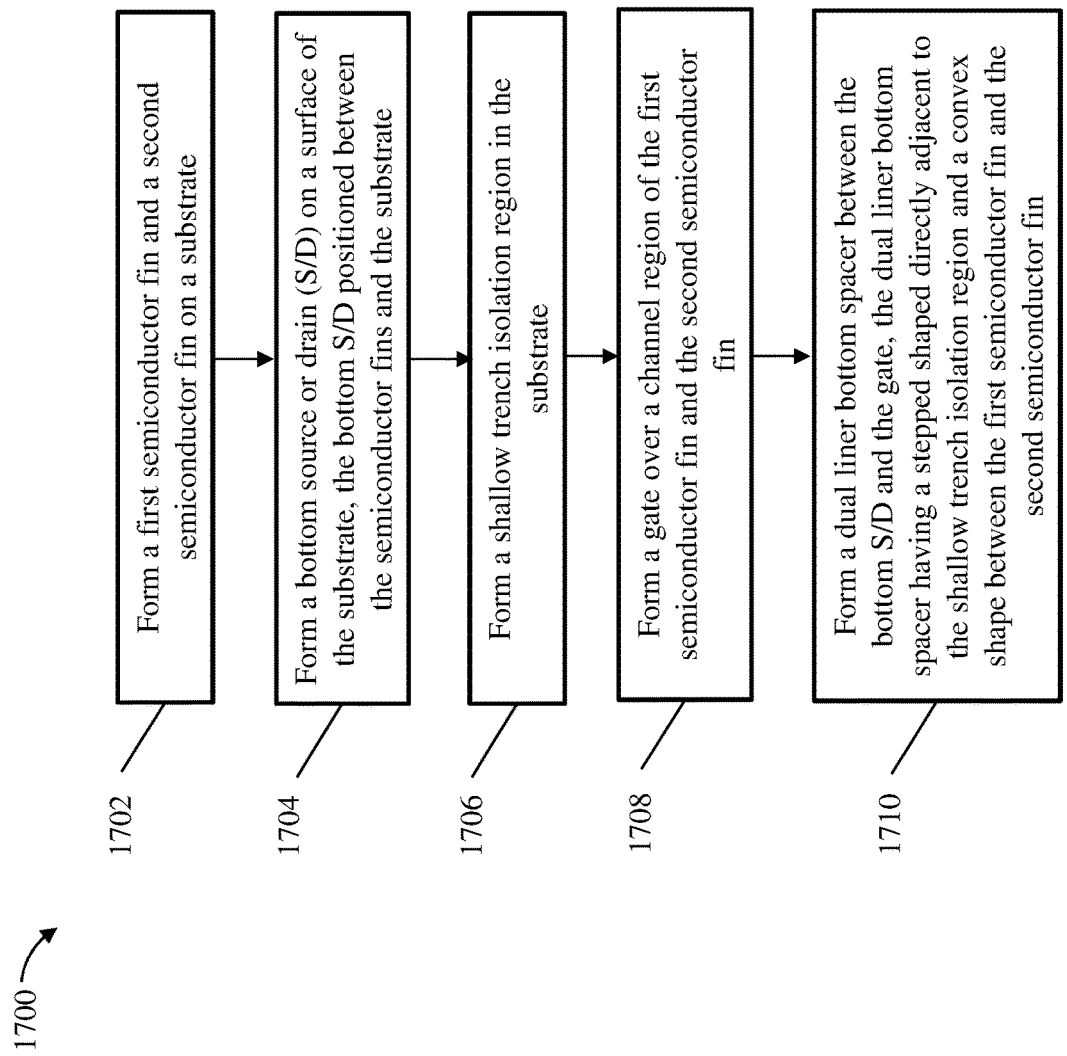
FIG. 17 depicts a flow diagram illustrating a method according to one or more embodiments of the invention.

FIG. 17 depicts a flow diagram 1700 illustrating a method for forming a semiconductor device according to one or more embodiments of the invention. As shown at block 1702, a first semiconductor fin and a second semiconductor fin are formed on a substrate. At block 1704, a bottom S/D is formed on a surface of the substrate. In some embodiments of the invention, the bottom S/D is positioned between the semiconductor fins and the substrate.

At block 1706, a shallow trench isolation region is formed in the substrate. At block 1708, a gate is formed over a channel region of the first semiconductor fin and the second semiconductor fin.

At block 1710, a dual liner bottom spacer is formed between the bottom S/D and the gate. In some embodiments of the invention, the dual liner bottom spacer includes an oxide liner and a nitride liner. In some embodiments of the invention, the oxide liner includes a stepped shaped directly adjacent to the shallow trench isolation region and a convex shape between the first semiconductor fin and the second semiconductor fin.

In some embodiments of the invention, forming the dual liner bottom spacer includes conformally depositing the oxide liner over a top surface of the bottom S/D and sidewalls of the first semiconductor fin and the second semiconductor fin. In some embodiments of the invention, forming the dual liner bottom spacer includes conformally depositing spacer material over the first liner and removing portions of the spacer material to define a spacer. In some embodiments of the invention, the spacer exposes a first region and a second region of the oxide liner. In some embodiments of the invention, the first region is directly on the bottom S/D and the second region is over the first semiconductor fin and the second semiconductor fin. In some embodiments of the invention, the spacer material includes amorphous silicon.

In some embodiments of the invention, a first portion of the nitride liner is formed by selectively depositing dielectric material on the exposed first region and exposed second region of the oxide liner. In some embodiments of the invention, a second portion of the nitride liner is formed by depositing additional dielectric material on the first portion of the nitride liner after removing the spacer. In some embodiments of the invention, the additional dielectric material is conformally deposited.

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, are used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (e.g., rotated 90 degrees or at other orientations), and the spatially relative descriptors used herein should be interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer or a conformal deposition) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a {100} orientated crystalline surface can take on a {100} orientation. In some embodiments of the invention of the invention, epitaxial growth and/or deposition processes can be selective to forming on semiconductor surface, and may or may not deposit material on exposed surfaces, such as silicon dioxide or silicon nitride surfaces.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (ME), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A semiconductor device comprising:
   a first semiconductor fin and a second semiconductor fin on a substrate;
   a bottom source or drain (S/D) on a surface of the substrate, the bottom S/D positioned between the semiconductor fins;
   an isolation region in the substrate;
   a gate over a channel region of the first semiconductor fin and a channel region of the second semiconductor fin; and a dual liner bottom spacer between the bottom S/D and the gate, the dual liner bottom spacer comprising a first liner and a second liner, the first liner comprising a stepped shape in a first region directly on the isolation region and a convex shape in a second region between the first semiconductor fin and the second semiconductor fin;

wherein the first liner in the first region is positioned directly on a top surface and a sidewall of the bottom S/D and on a second sidewall of the first semiconductor fin.

2. The semiconductor device of claim 1, wherein the first liner comprises an oxide liner and the second liner comprises a nitride liner.

3. The semiconductor device of claim 1, wherein the first liner in the second region is positioned directly on a top surface of the bottom S/D, on a first sidewall of the first semiconductor fin, and on a second sidewall of the second semiconductor fin.

4. The semiconductor device of claim 1, wherein the first liner in the second region is in direct contact with the gate.

5. The semiconductor device of claim 1, wherein the first semiconductor fin and the second semiconductor fin each comprise a vertical tunneling field effect transistor (VFET).

* * * * *